United States Patent
Chang et al.

(10) Patent No.: US 8,110,467 B2
(45) Date of Patent: Feb. 7, 2012

(54) MULTIPLE VT FIELD-EFFECT TRANSISTOR DEVICES

(75) Inventors: Josephine B. Chang, Yorktown Heights, NY (US); Leland Chang, Yorktown Heights, NY (US); Renee T. Mo, Hopewell Junction, NY (US); Vijay Narayanan, Yorktown Heights, NY (US); Jeffrey W. Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 282 days.

(21) Appl. No.: 12/427,247

(22) Filed: Apr. 21, 2009

(65) Prior Publication Data

US 2010/0264497 A1   Oct. 21, 2010

(51) Int. Cl.
  *H01L 21/8236* (2006.01)
(52) U.S. Cl. ........ 438/277; 438/152; 438/157; 438/275; 438/283; 257/350; 257/393; 257/E21.09; 257/E21.629; 257/E27.06
(58) Field of Classification Search .................. 438/151, 438/152, 157, 277, 283; 257/350, 393, E27.06, 257/E21.09, E21.629
  See application file for complete search history.

(56) References Cited

U.S. PATENT DOCUMENTS

| | | | |
|---|---|---|---|
| 5,352,624 A | 10/1994 | Miwa et al. | |
| 6,146,970 A | 11/2000 | Witek et al. | |
| 6,448,590 B1 | 9/2002 | Adkisson et al. | |
| 6,720,619 B1 | 4/2004 | Chen et al. | |
| 6,797,553 B2 | 9/2004 | Adkisson et al. | |
| 6,853,020 B1 | 2/2005 | Yu et al. | |
| 6,855,989 B1 | 2/2005 | Wang et al. | |
| 7,288,805 B2* | 10/2007 | Anderson et al. | 257/250 |
| 7,332,386 B2* | 2/2008 | Lee et al. | 438/197 |
| 7,501,674 B2* | 3/2009 | Lee et al. | 257/288 |
| 7,534,669 B2* | 5/2009 | Anderson et al. | 438/164 |
| 7,781,274 B2* | 8/2010 | Nakabayashi et al. | 438/157 |
| 7,859,081 B2* | 12/2010 | Doyle et al. | 257/534 |
| 7,932,564 B2* | 4/2011 | Goto et al. | 257/368 |
| 2005/0093067 A1 | 5/2005 | Yeo et al. | |
| 2005/0104096 A1* | 5/2005 | Lee et al. | 257/288 |
| 2006/0057787 A1* | 3/2006 | Doris et al. | 438/153 |
| 2006/0081895 A1* | 4/2006 | Lee et al. | 257/288 |
| 2006/0270156 A1 | 11/2006 | Kim et al. | |
| 2006/0289948 A1 | 12/2006 | Brown et al. | |
| 2007/0013413 A1 | 1/2007 | Chiang et al. | |
| 2007/0075351 A1* | 4/2007 | Schulz et al. | 257/314 |
| 2007/0111448 A1* | 5/2007 | Li et al. | 438/264 |
| 2007/0148843 A1* | 6/2007 | Saito et al. | 438/197 |

(Continued)

OTHER PUBLICATIONS

V. Kursun, et al., "Leakage-Aware Design of Nanometer SoC," IEEE International Symposium on Circuits and Systems, p. 4, May 27-30, 2007, New Orleans, LA.: Multi-threshold voltage single-gate and double-gate FinFETs (2007).

(Continued)

*Primary Examiner* — Thao Le
*Assistant Examiner* — Eric Jones
(74) *Attorney, Agent, or Firm* — Vazken Alexanian; Michael J. Chang, LLC

(57) ABSTRACT

Multiple threshold voltage (Vt) field-effect transistor (FET) devices and techniques for the fabrication thereof are provided. In one aspect, a FET device is provided including a source region; a drain region; at least one channel interconnecting the source and drain regions; and a gate, surrounding at least a portion of the channel, configured to have multiple threshold voltages due to the selective placement of at least one band edge metal throughout the gate.

11 Claims, 10 Drawing Sheets

U.S. PATENT DOCUMENTS

| | | | |
|---|---|---|---|
| 2007/0164785 A1 | 7/2007 | He | |
| 2007/0257325 A1* | 11/2007 | Rachmady et al. | 257/401 |
| 2007/0269950 A1* | 11/2007 | Anderson et al. | 438/285 |
| 2008/0050898 A1 | 2/2008 | Luan | |
| 2008/0157207 A1* | 7/2008 | Rachmady et al. | 257/365 |
| 2008/0169512 A1* | 7/2008 | Doyle et al. | 257/369 |

OTHER PUBLICATIONS

T. Thorp, et al., "Monotonic Static CMOS and Dual Vt Technology," ISLPED99, San Diego, CA, Aug. 16-17, pp. 151-155 (1999).

* cited by examiner

| | CASE 1: $Vt_1$ = 300 mV | | CASE 2: $Vt_2$ = 600 mV | | CASE 3: DUAL Vt | |
|---|---|---|---|---|---|---|
| | Vdd = 1V | Vdd ≈ 0.5V | Vdd = 1V | Vdd ≈ 0.5V | Vdd = 1V | Vdd ≈ 0.5V |
| CAPACITANCE | ~C | ~C | ~C | NOT APPLICABLE | ~C | ~C/2 |
| DRIVE CURRENT | ~I | ~0.28 I | ~0.57 I | NOT APPLICABLE | ~0.78 I | ~0.14 I |
| POWER | ~C | ~0.25 C | ~C | NOT APPLICABLE | ~C | ~0.125 C |
| PERFORMANCE | ~I/C | ~1.12 I/C | ~0.57 I/C | NOT APPLICABLE | ~0.78 I/C | ~1.12 I/C |

US 8,110,467 B2

MULTIPLE VT FIELD-EFFECT TRANSISTOR DEVICES

FIELD OF THE INVENTION

The present invention relates to field-effect transistor (FET) devices, and more particularly, to multiple threshold voltage (Vt) FET devices and techniques for the fabrication thereof.

BACKGROUND OF THE INVENTION

Field-effect transistors (FETs) are used in many integrated circuit designs as switches to open and close the circuits. In general, a FET includes a source region and a drain region connected by a channel, and a gate that regulates electron flow through the channel between the source and drain regions. The channel can include an n-type or p-type semiconductor material, forming an n-channel FET (NFET) or a p-channel FET (PFET), respectively.

One particular type of FET, a finFET, is favored in some applications due to its fast switching times and high current densities. In its basic form, a finFET includes a source region, a drain region and one or more fin-shaped channels between the source and drain regions. A gate electrode over the fin(s) regulates electron flow between the source and the drain.

With continued scaling of electronics technologies, power, performance and density trade-offs become increasingly challenging to manage. Many strategies exist to manage power at the chip level, such as powering down non-active blocks or reducing supply voltage ($V_{dd}$) during a sleep mode. However, most of these approaches involve design overhead in terms of either managing the power-down and/or designing the circuits robustly so that they will maintain state at a lowered $V_{dd}$ (where compact models typically have poor accuracy).

Often, the lower $V_{dd}$ is determined empirically once the final design is made. As a result, conventional devices will almost always have higher design costs to ensure the circuit design functions at lower $V_{dd}$. This cost arises from both checking the design itself over a wider range of voltages, as well as ensuring the model itself is well calibrated across this range of $V_{dd}$'s, which is often non-trivial. Plus, there is also the risk that if these tasks are not performed correctly, the costs associated with a re-design cycle might also be incurred.

Therefore, FET devices that provide power savings through low active power operations that can be easily and economically implemented with available processing technology would be desirable.

SUMMARY OF THE INVENTION

The present invention provides multiple threshold voltage (Vt) field-effect transistor (FET) devices and techniques for the fabrication thereof. In one aspect of the invention, a FET device is provided including a source region; a drain region; at least one channel interconnecting the source and drain regions; and a gate, surrounding at least a portion of the channel, configured to have multiple threshold voltages due to the selective placement of at least one band edge metal throughout the gate.

In another aspect of the invention, a method for fabricating a FET device is provided. The method includes the following steps. A plurality of fins is patterned in a silicon-on-insulator (SOI) layer each fin having a first side and a second side opposite the first side. A dielectric layer is formed over each of the fins. A gate is formed that surrounds at least a portion of each of the fins and is separated from the fins by the dielectric layer, the gate being configured to have multiple threshold voltages due to the selective placement of at least one band edge metal throughout the gate. A source region and a drain region are formed interconnected by the fins.

In yet another aspect of the invention, another method for fabricating a FET device is provided. The method includes the following steps. A base is patterned in a SOI layer having a first side, a second side opposite the first side and a top. A dielectric layer is formed over the base. A gate is formed that surrounds at least a portion of the base and is separated from the base by the dielectric layer, the gate being configured to have multiple threshold voltages due to the selective placement of at least one band edge metal throughout the gate. A source region and a drain region are formed on opposite sides of the gate.

A more complete understanding of the present invention, as well as further features and advantages of the present invention, will be obtained by reference to the following detailed description and drawings.

BRIEF DESCRIPTION OF THE DRAWINGS

FIGS. 4C-L are cross-sectional diagrams illustrating the creation of a dual Vt gate of the MOSFET device of FIG. 3 according to an embodiment of the present invention;

FIG. 5 is a table illustrating performance of two single Vt FET devices and a dual Vt FET device according to an embodiment of the present invention.

DETAILED DESCRIPTION OF PREFERRED EMBODIMENTS

Field-effect transistor (FET) devices having multiple threshold voltages (Vt's) and techniques for the fabrication thereof are provided herein. A number of different FET device designs will be presented each of which is configured with a multiple Vt gate due to the selective placement of one or more band edge metals throughout the gate (see below). The first devices presented are dual Vt finFET devices.

Figure 1:
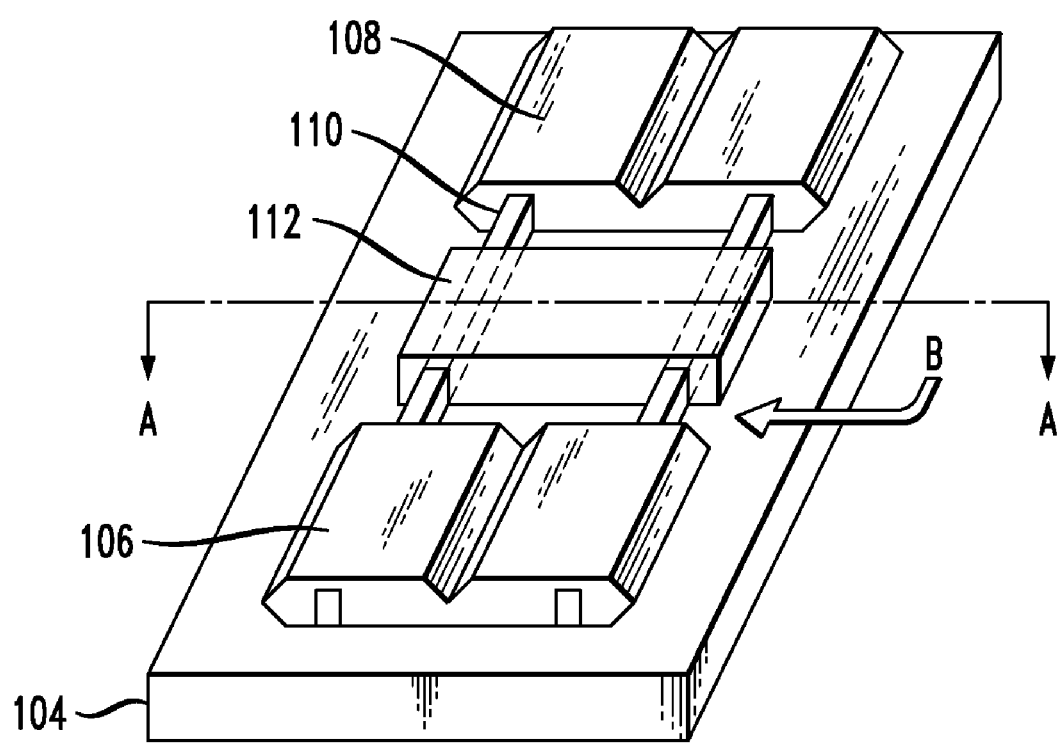
FIG. 1 is a schematic diagram illustrating an exemplary fin field-effect transistor (finFET) device according to an embodiment of the present invention.

FIG. 1 is a schematic diagram illustrating an exemplary finFET device 100. FinFET device 100 includes a source region 106, a drain region 108 and a plurality of fins 110 interconnecting the source and drain regions. Fins 110 are patterned in a silicon-on-insulator (SOI) layer wherein the insulator is a buried oxide (BOX) 104. A gate 112 surrounds at least a portion of each of fins 110.

Fins 110 serve as channels of the device. Each fin has two sides (a first side and a second side opposite the first side). As will be described in detail below, according to the present teachings, a portion of the gate adjacent to the first side of each fin is configured to have a threshold voltage $Vt_1$ and a portion of the gate adjacent to the second side of each fin is configured to have a threshold voltage $Vt_2$, wherein $Vt_2$ is different from $Vt_1$ (i.e., a differential threshold voltage) due to at least one band edge metal being present in the portion of the gate adjacent to the first side of each fin.

Figure 2A:
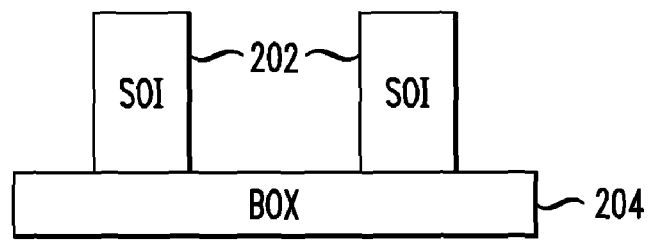
FIGS. 2A and 2B are cross-sectional diagrams illustrating the formation of fins (channels) and a gate dielectric of the finFET device of FIG. 1 according to an embodiment of the present invention.
Figure 2B:
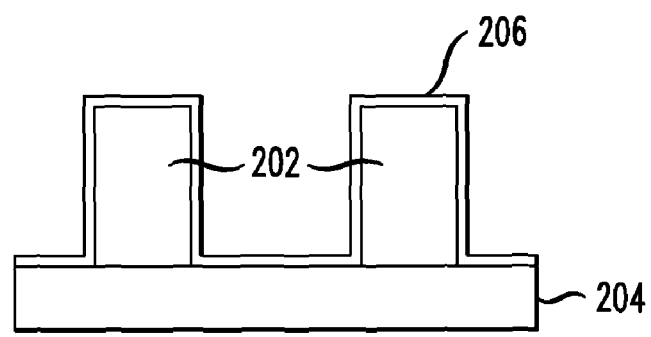
Figure 2C:
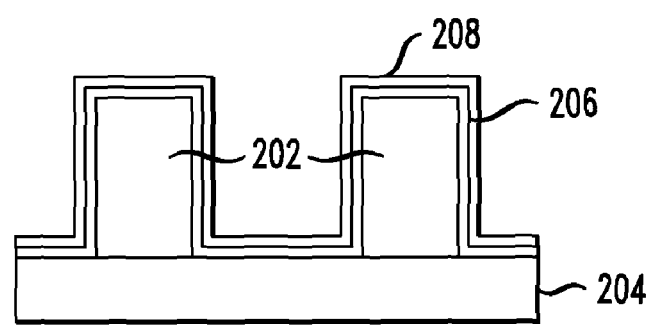
FIGS. 2C-F are cross-sectional diagrams illustrating the creation of a dual Vt gate of the finFET device of FIG. 1 according to an embodiment of the present invention.
Figure 2D:
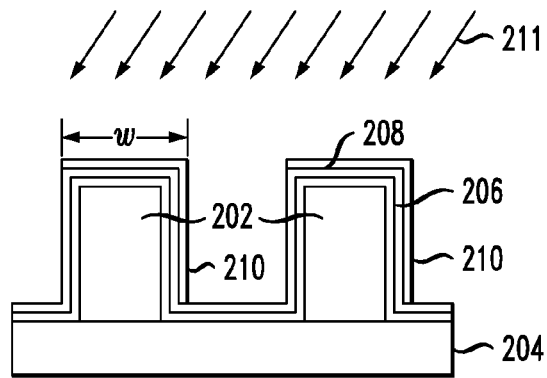
Figure 2E:
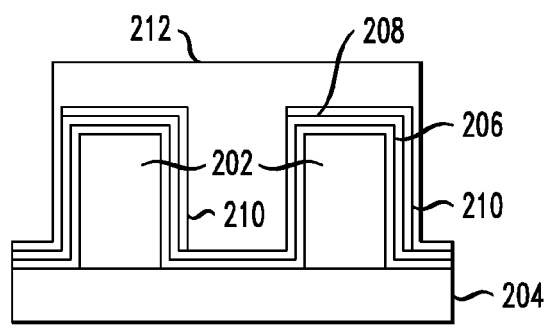
Figure 2F:
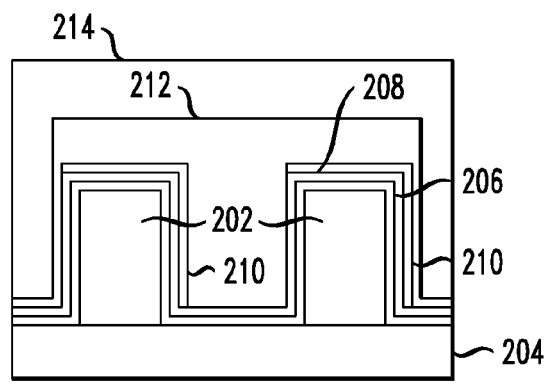
Figure 2G:
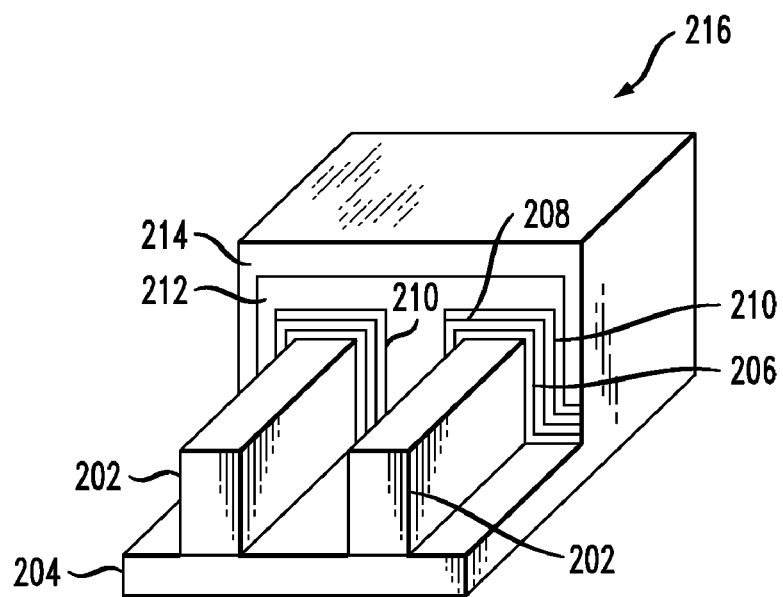
FIGS. 2G-I are cross-sectional diagrams illustrating the formation of source/drain regions of the finFET device of FIG. 1 according to an embodiment of the present invention.
Figure 2H:
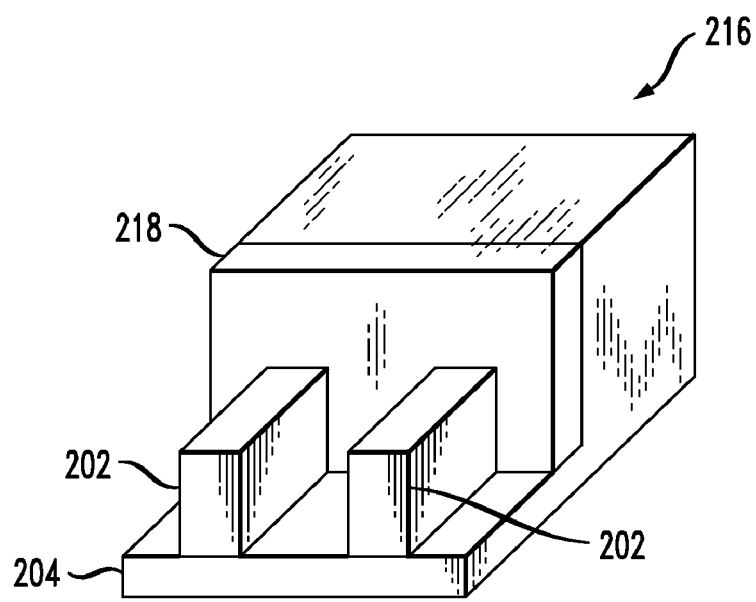
Figure 2I:
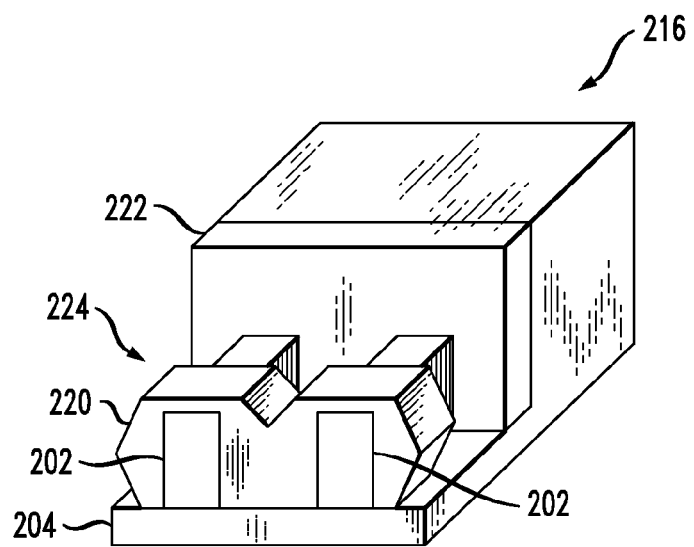

FIGS. 2A-I are diagrams illustrating an exemplary methodology for fabricating a finFET device, such as finFET device 100 described in conjunction with the description of FIG. 1, above. Namely, FIGS. 2A and 2B highlight, by way of reference to cross-sectional views through plane A (see FIG. 1), the formation of fins (channels) and a gate dielectric. FIGS. 2C-F highlight, by way of reference to cross-sectional views through plane A (see FIG. 1), the creation of a dual Vt gate over the fins. FIGS. 2G-I highlight, by way of reference to views from vantage point B (see FIG. 1), the formation of source/drain regions of the device.

According to an exemplary embodiment, the starting platform for the device is a conventional SOI wafer having a SOI layer over a BOX. A substrate is typically present adjacent to a side of the BOX opposite the SOI layer (not shown in the instant diagrams). As shown in FIG. 2A, a plurality of fins 202 are patterned, i.e., using standard patterning techniques, in the SOI layer over the BOX, i.e., BOX 204. Each fin 202 patterned in this manner will have two sides (opposite one another) and a top. For ease and consistency of description, the sides are hereinafter referred to as a first side and a second side, with the first side arbitrarily referring to a left side of each fin and the second side arbitrarily referring to a right side of each fin (based on the representations shown in FIG. 2A). Further, as shown in FIG. 2A, all of the fins have a common orientation wherein the first side of each fin faces one direction (e.g., to the left) and the second side of each fin faces the opposite direction (e.g., to the right).

As shown in FIG. 2B, dielectric layer 206 is formed over exposed portions of BOX 204 and over each fin 202 patterned in the SOI layer. Dielectric layer 206 can include one or more of silicon dioxide ($SiO_2$) and silicon oxynitride (SiON) and can be deposited using standard thermal oxidation or rapid thermal process (RTP) oxidation to a thickness of from about 0.7 nanometers (nm) to about three nm. Alternatively, dielectric layer 206 can include a hafnium-based high-k material, such as hafnium oxide ($HfO_2$), hafnium zirconate ($HfZrO_4$), hafnium silicate (HfSiO) and/or nitrided hafnium silicate (HfSiON), and can be deposited using a suitable high-k material deposition process, such as chemical vapor deposition (CVD) or atomic layer deposition (ALD), to a thickness of from about one nm to about five nm. The use of a high-k dielectric is preferable in situations where metal gates are used and/or when a dielectric with scaling properties advantageous to $SiO_2$ is required. Dielectric layer 206 will separate each fin 202 from a gate of the device, and thus dielectric layer 206 serves as a gate dielectric.

The formation of the gate begins, as shown in FIG. 2C, with the deposition of a first metal layer 208 over the dielectric layer. The first metal layer can include titanium nitride (TiN), tantalum nitride (TaN) and/or tantalum carbide (TaC) and can be deposited using ALD to a thickness of from about five nm to about 50 nm. According to an exemplary embodiment, the first metal layer does not include any band edge metal. On the other hand, if a band edge metal is present in the first metal layer, then according to the present teachings a concentration of the band edge metal in the first metal layer is less than a concentration of a band edge metal in the second metal layers, see FIG. 2D, described below.

As shown in FIG. 2D, a series of second metal layers 210 are selectively deposited over portions of first metal layer 208 at the top and at one of the sides of each fin. While FIG. 2D depicts selective deposition on the second side of each fin, this is merely exemplary, as the series of second metal layers 210 can, alternatively, be selectively deposited on the first side of each fin. This selective deposition can be achieved using directional deposition techniques and/or differential deposition techniques (e.g., as illustrated by arrows 211). For example, second metal layers 210 can be deposited using thermal evaporation or electron-beam (e-beam) evaporation. According to the present teachings, second metal layers 210 include a conventional gate metal, such as TiN, TaN and/or TaC, doped with at least one band edge metal. The particular band edge metal(s) used in second metal layers 210 can vary depending on whether the finFET device being fabricated is an n-channel finFET (abbreviated herein as "NFET") or a p-channel finFET (abbreviated herein as "PFET"). When an NFET device is being fabricated, the band edge metal(s) can include any group IIA (alkaline earth metals)/group IIIB (lanthanides) column element, such as one or more of magnesium (Mg), barium (Ba), strontium (Sr) (group IIA), lanthanum (La), yttrium (Y), dysprosium (Dy), cerium (Ce), praseodymium (Pr), ytterbium (Yb) and lutetium (Lu) (group IIIB). On the other hand, when a PFET device is being fabricated, the band edge metal(s) can include one or more of aluminum (Al), rhodium (Rh), rhenium (Re), platinum (Pt), tungsten (W), nickel (Ni), cobalt (Co), aluminum dioxide ($AlO_2$), titanium dioxide ($TiO_2$), tantalum oxide ($Ta_2O_5$), nickel oxide (NiO) and cobalt oxide ($Co_2O_3$). According to an exemplary embodiment, second metal layers 210 are formed by first depositing the conventional gate metal onto the desired side (i.e., either first side or second side) of each fin over first metal layer 208 using, e.g., thermal evaporation or e-beam evaporation to a thickness of from about five nm to about 50 nm. The appropriate band edge metal(s) is then deposited over the conventional gate metal again using, e.g., thermal evaporation or e-beam evaporation to a thickness of from about one angstrom (Å) to about 20 Å (the thickness depending on the desired concentration of the band edge metal in the second metal layers). The conventional and band edge metals are then interdiffused throughout second metal layers 210 using an annealing process which can be conducted immediately after the metal depositions, or alternatively, after completion of the gate as a final source/drain activation anneal (see below). The parameters used for such annealing processes are well known to those of skill in the art and thus are not described further herein.

According to the configuration shown illustrated in FIG. 2D, a portion of the gate adjacent to the first side of each fin will have a threshold voltage $Vt_1$ due to the presence of first metal layer 208 (e.g., a non-band edge metal) in the portion of the gate adjacent to the first side of each fin, and the second side of each fin will have a threshold voltage $Vt_2$, wherein $Vt_2$ is different from $Vt_1$ due to the presence of second metal layer 210 (e.g., having a band edge metal) in the portion of the gate adjacent to the second side of each fin. A width of each fin (labeled w in FIG. 2D) is generally small enough that any Vt contribution from a portion of the gate adjacent to the top of each fin can be neglected. According to an exemplary embodiment, $Vt_2 < Vt_1$ because the band edge metal(s) will typically lower the Vt. Therefore, as highlighted above, if a band edge metal is present in both the first and the second metal layers and if more band edge metal is present in the second metal layers, then the portion of the gate adjacent to the second side of each fin will have a lower Vt than the portion of the gate adjacent to the first side of each fin. A finFET device with these properties will operate excellently in low supply voltage ($V_{dd}$) ($Vt_2 > V_{dd} > Vt_1$), low power mode. When the $V_{dd}$ is increased above $Vt_2$, the device will operate in a high performance mode.

As shown in FIG. 2E, third metal layer 212 is deposited over first metal layer 208 and second metal layers 210. Third metal layer 212 can include TiN, TaN and/or TaC and can be deposited using CVD or ALD to a thickness of from about five nm to about 50 nm.

As shown in FIG. 2F, a polysilicon layer, i.e., polysilicon layer 214, can optionally be deposited over third metal layer 212. Polysilicon makes the gate compatible with subsequent self-aligned silicidation (when the source/drain regions are silicided). Alternatively, a contact scheme that is compatible with a metal gate would eliminate the need for the polysilicon layer. Additionally, some metal gates (such as TiN/TaN) have lower conductance than silicided polysilicon, so the polysilicon gate that received subsequent silicidation might have lower resistance along the gate. Polysilicon layer 214 can be deposited using CVD, plasma enhanced chemical vapor deposition (PECVD) or rapid thermal chemical vapor deposition (RTCVD) to a thickness of from about 30 nm to about 150 nm.

Any further standard processing of the gate may then be carried out, if required. By way of example only, the fins can be annealed, e.g., to interdiffuse the metals in the metal layers as described above. The gate is now completed.

Standard processing can then also be used to form source and drain regions at opposite ends of the gate and interconnected by the fins. For example, switching now to a view from vantage point B (see, for example, FIG. 1), FIG. 2G shows completed gate 216 formed over fins 202 as described above. FIGS. 2G-I illustrate the formation of either a source region or a drain region on one side of the gate, however it is to be understood that the same processes apply to forming the counterpart source region or drain region on the opposite side of the gate. As shown in FIG. 2H, offset spacers 218 are formed on either side of gate 216. According to an exemplary embodiment, the offset spacers include silicon nitride (SiN). Extension implants into fins 202 in the source/drain regions is also performed. As shown in FIG. 2I, epitaxial Si 220 is grown over fins 202. Offset spacers 218 (see FIG. 2H) are removed and replaced by final spacers 222. Source/drain implants are then introduced to the region, followed by a rapid thermal anneal. As a result, source/drain region 224 is formed. Silicide contacts (not shown) to the source/drain regions may also be formed. The specific parameters for source region/drain region and silicide formation techniques are well known to those of skill in the art and thus are not described further herein.

The next devices presented are dual Vt metal-oxide semiconductor field-effect transistor (MOSFET) devices. By comparison with the finFET devices presented above, these MOSFET devices are trigate devices with a top and two sides of the gate contributing to the Vt of the device.

Figure 3:
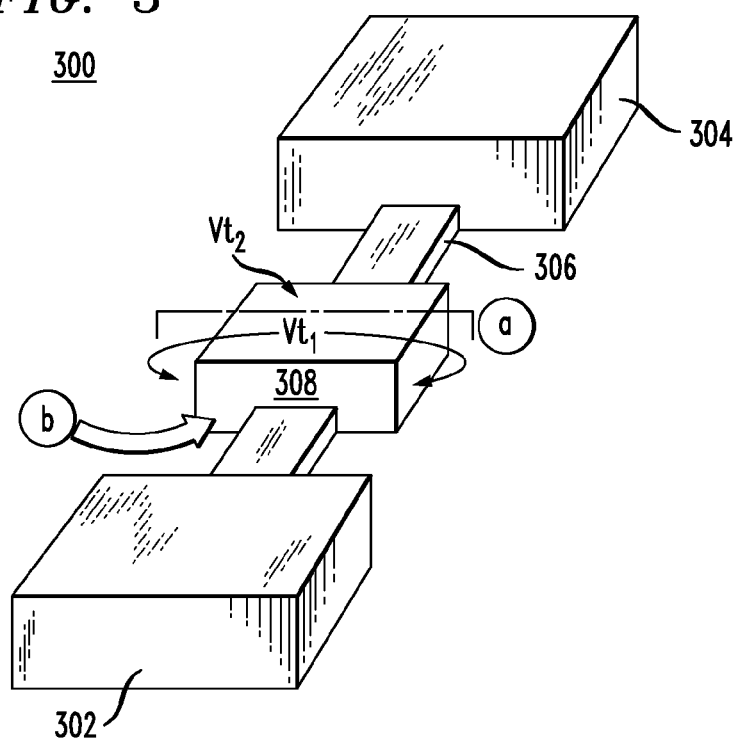
FIG. 3 is a schematic diagram illustrating an exemplary metal-oxide semiconductor field-effect transistor (MOSFET) device according to an embodiment of the present invention.

FIG. 3 is a schematic diagram illustrating exemplary MOSFET device 300. MOSFET device 300 includes a source region 302, a drain region 304, a channel 306 interconnecting source region 302 and drain region 304 and a gate 308 surrounding at least a portion of channel 306. As will be described in detail below, gate 308 has a dual Vt design, wherein two sides of gate 308 have a first threshold voltage $Vt_1$ and a top of gate 308 has a second threshold voltage $Vt_2$ due to the selective placement of one or more band edge metals throughout the gate. The use of a dual Vt gate design allows MOSFET device 300 to be run in either a low active power mode or a high performance mode, thus providing savings through an overall reduced power consumption without undesirable performance degradation.

Figure 4A:
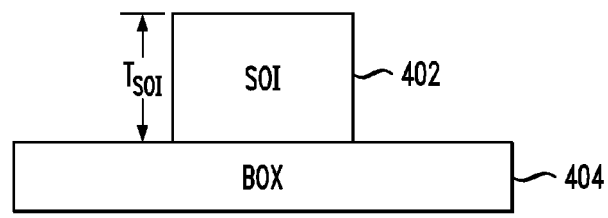
FIGS. 4A and 4B are cross-sectional diagrams illustrating the creation of a base and gate dielectric for the MOSFET device of FIG. 3 according to an embodiment of the present invention.
Figure 4B:
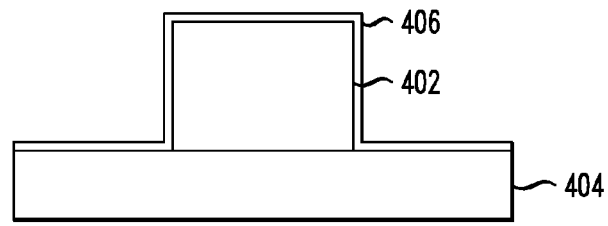
Figure 4C:
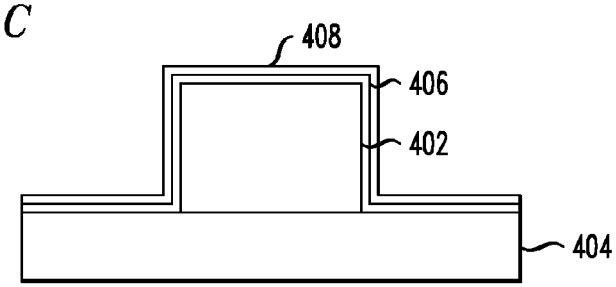
Figure 4D:
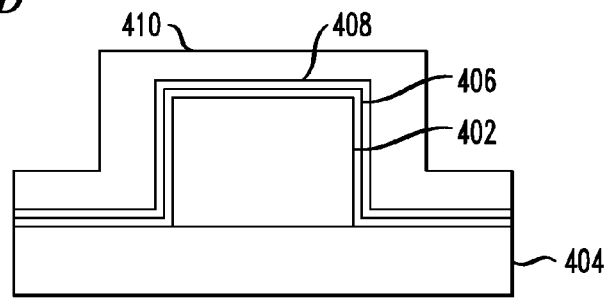
Figure 4E:
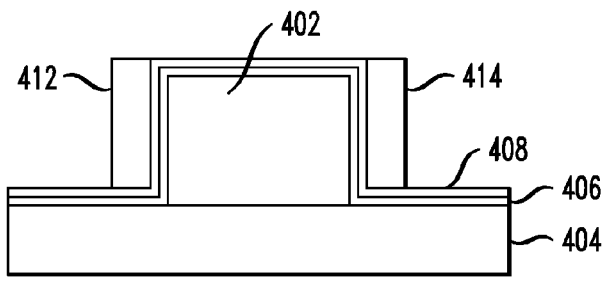
Figure 4F:
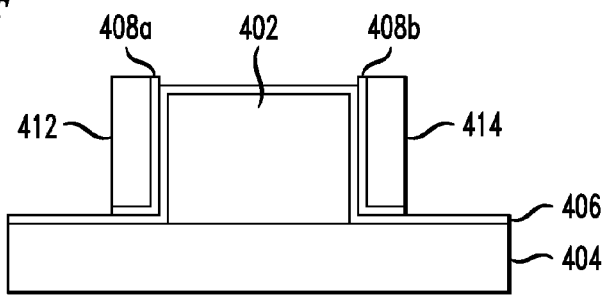
Figure 4G:
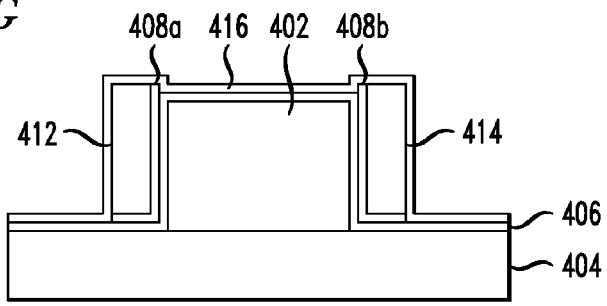
Figure 4G:
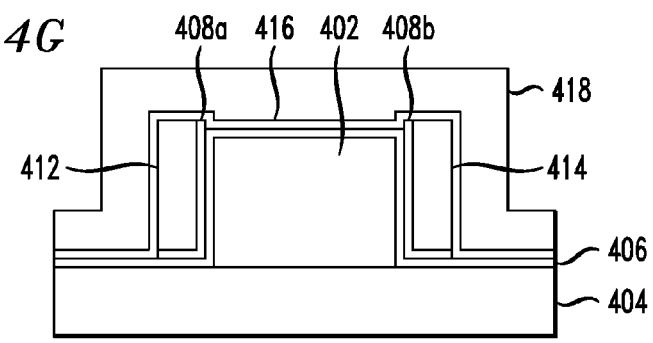
Figure 4I:
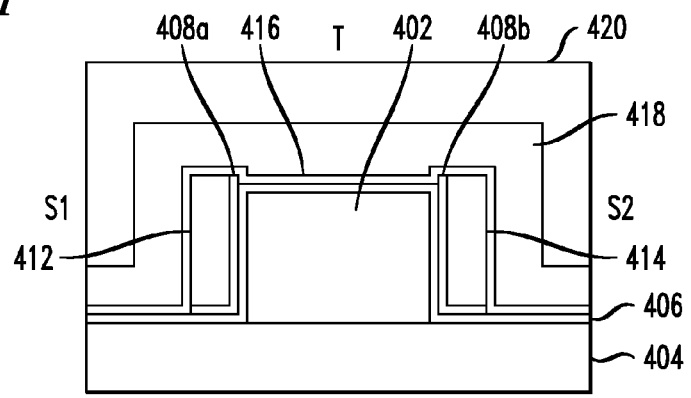
Figure 4J:
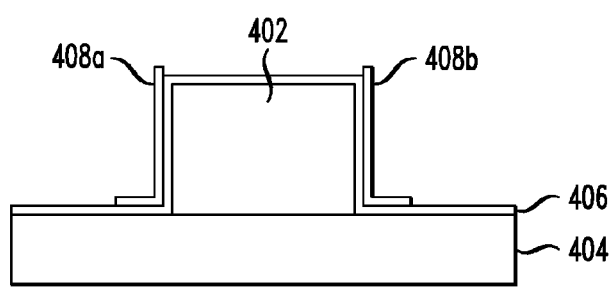
Figure 4K:
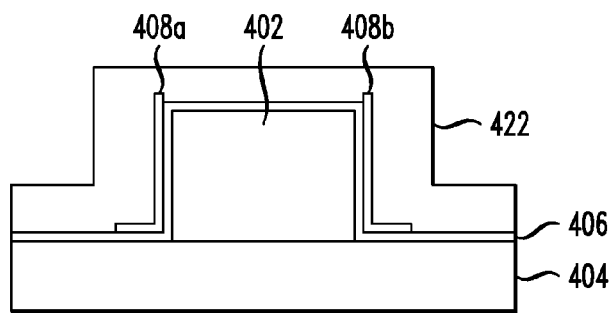
Figure 4L:
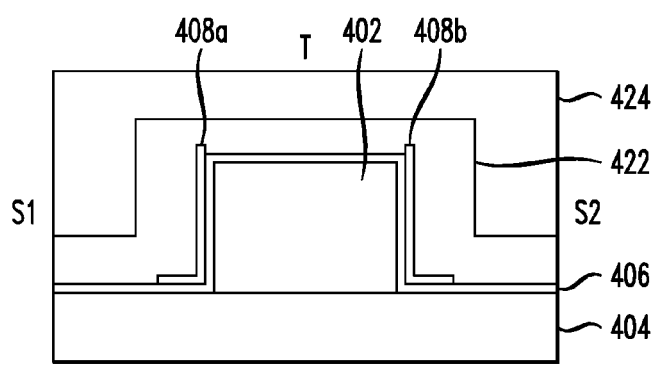
Figure 4M:
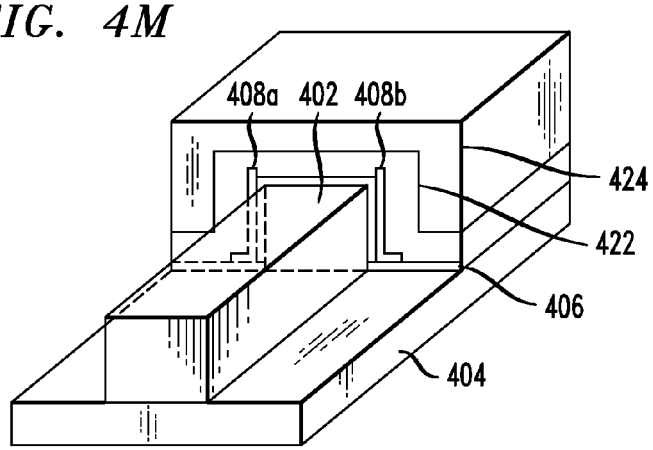
FIGS. 4M-O are cross-sectional diagrams illustrating the formation of source/drain regions of the MOSFET device of FIG. 3 according to an embodiment of the present invention.
Figure 4N:
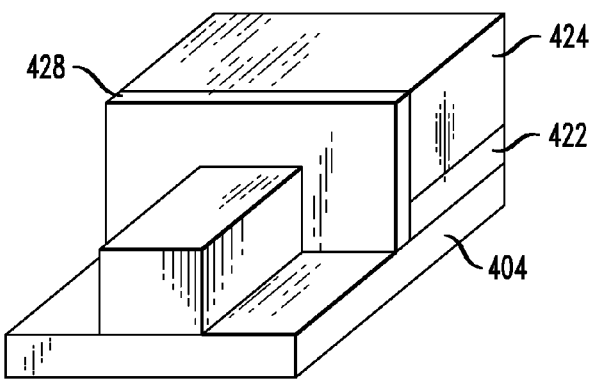
Figure 4O:
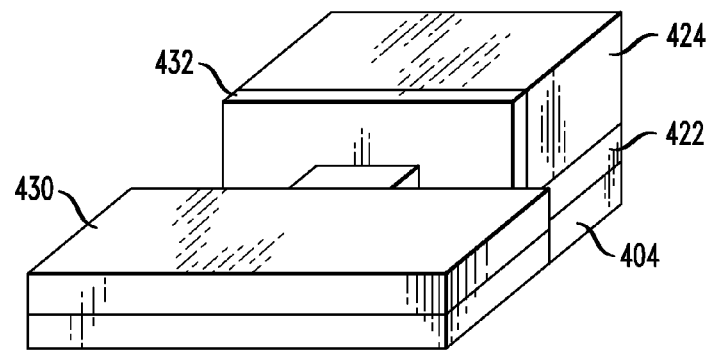

FIGS. 4A-O are cross-sectional diagrams illustrating an exemplary methodology for forming a MOSFET device, such as MOSFET device 300 described in conjunction with the description of FIG. 3, above. Namely, FIGS. 4A and 4B highlight, by way of reference to cross-sectional views through plane a (see FIG. 3), the creation of a base for the device and a gate dielectric layer over the base that will separate a portion of the base that will serve as a channel of the device from a gate of the device. See below. FIGS. 4C-L highlight, by way of reference to cross-sectional views through plane a (see FIG. 3), the creation of a dual Vt gate. FIGS. 4M-O highlight, by way of reference to views from vantage point b (see FIG. 3), the formation of source/drain regions of the device. As highlighted above, the MOSFET devices described herein are trigate devices. As the name implies, a trigate includes three active portions, in this case a top surface and two sides. As will be described in detail below, with the present techniques, the sides of the trigate are both configured to have a same threshold voltage $Vt_1$ while the top is configured to have a different threshold voltage $Vt_2$ (this configuration is referred to herein as a "dual Vt" configuration). A device with these properties will operate excellently in a low power mode when a low supply voltage ($V_{dd}$) is provided, i.e., $Vt_2 > V_{dd} > Vt_1$. When $V_{dd}$ is increased above $Vt_2$, the device will operate in a high performance mode. Trigate devices are receiving substantial attention as candidates for 22 nm technologies and beyond. Trigate devices offer better electrostatic control, permitting gate length scaling. In addition, the current available per planar layout increases (i.e., as compared to conventional planar configurations), as the sides are now gated regions.

The starting platform for the device can be a SOI wafer or a bulk silicon wafer. A SOI wafer having an SOI layer over a BOX is chosen for use in the instant description. As shown in FIG. 4A, the SOI layer of the wafer is patterned, e.g., using standard lithography techniques, to form a base 402 for the device over the BOX, i.e., BOX 404. An SOI wafer commonly also includes a substrate adjacent to a side of the BOX opposite the SOI layer, which is not shown in the instant diagrams. Later in the process, a source region, a drain region and a gate will be formed over base 402 with a portion of the base between the source and drain regions and under the gate serving as a channel of the device. The gate will be configured as a trigate having two sides (a first side and a second side opposite the first side) and a top. Accordingly, base 402 has a first side, a second side opposite the first side and a top which will correspond to the first side, second side and top of the gate, respectively, adjacent thereto.

The starting SOI wafer can be partially or fully depleted. When a SOI wafer having a thicker SOI layer is used (SOI thickness $T_{SOI}$ is greater than or equal to 30 nm) or when a bulk silicon wafer is used, the wafer is preferably partially depleted. When a SOI wafer having a thinner SOI layer is used ($T_{SOI}$ is less than or equal to 30 nm) the wafer is preferably fully depleted.

As shown in FIG. 4B, dielectric layer 406 is then formed over base 402 and exposed portions of BOX 404. Dielectric layer 406 will separate the channel of the device from a gate of the device and thus dielectric layer 406 serves as a gate dielectric. Dielectric layer 406 can include one or more of $SiO_2$ and SiON and can be formed using standard thermal or RTP oxidation to a thickness of from about 0.7 nm to about three nm. Alternatively, dielectric layer 406 can include a hafnium-based high-k material, such as $HfO_2$, $HfZrO_4$, HfSiO and/or HfSiON and can be formed using CVD or ALD to a thickness of from about one nm to about five nm. The use of a high-k dielectric is preferable in situations where metal gates are used and/or when a dielectric with scaling properties advantageous to $SiO_2$ is required.

The formation of the gate begins, as shown in FIG. 4C, with the deposition of a metal layer 408 over dielectric layer 406. According to the present teachings, metal layer 408 includes a conventional gate metal, such as TiN, TaN and/or TaC, doped with at least one band edge metal. The particular band edge metal(s) used in metal layer 408 can vary depending on whether the MOSFET device being formed is an n-channel MOSFET (NMOSFET) or a p-channel MOSFET device (PMOSFET). When an NMOSFET is being formed, the band edge metal(s) can include a group IIA (alkaline earth metals)/group IIIB (lanthanides) column element, such as one or more of Mg, Ba, Sr (group IIA), La, Y, Dy, Ce, Pr, Yb and Lu (group IIIB). Alternatively, when a PMOSFET is being formed, the band edge metal(s) can include one or more of Al, Rh, Re, Pt, W, Ni, Co, $AlO_2$, $TiO_2$, $Ta_2O_5$, NiO and $Co_2O_3$. According to an exemplary embodiment, metal layer 408 is formed by first depositing the conventional gate metal over dielectric layer 406 using CVD, ALD, sputtering or thermal evaporation to a thickness of from about five nm to about 50 nm. The appropriate band edge metal(s) is then deposited over the conventional gate metal again using CVD, ALD, sputtering or thermal evaporation to a thickness of from about two Å to about three Å. The conventional and band edge metals are then interdiffused throughout metal layer 408 using an annealing process which can be conducted immediately after the metal depositions, or alternatively, after completion of the gate as part of a final source/drain activation anneal. The parameters used for such annealing processes are well known to those of skill in the art and thus are not described further herein.

As shown in FIG. 4D, an offset spacer precursor layer 410 is deposited over metal layer 408. Spacer precursor layer 410 can include one or more of polysilicon or amorphous silicon and can be conformally deposited over metal layer 408 using CVD, PECVD or RTCVD to a thickness of from about three nm to about 15 nm. Spacer precursor layer 410 can be pre-doped in situ with phosphorus (P) or arsenic (As) for NMOSFET or boron (B) for PMOSFET if an additional band edge metal layer is going to be used (see, for example, FIGS. 4G-I, described below). Alternatively, if an additional band edge metal layer is not going to be used (see, for example, FIGS. 4J-L, described below), then spacer precursor layer 410 may also include a non-conductive dielectric, such as SiN, since the offset spacers formed therefrom will be subsequently removed during processing, see below.

As shown in FIG. 4E, offset spacers 412 and 414 are then formed from spacer precursor layer 410 on each side of base 402 adjacent to metal layer 408. According to an exemplary embodiment, reactive ion etching (RIE) is used to form offset spacers 412 and 414, which will remove spacer precursor layer 410 from all horizontal surfaces, including from over a top of base 402 which exposes a portion of metal layer 408.

As shown in FIG. 4F, the portion of metal layer 408 exposed by the RIE is selectively removed from the top of base 402 (i.e., from over a portion of the dielectric layer on top of the base), for example, using wet etching. This process essentially forms two separate layers from metal layer 408, one on each side (i.e., on the first side and second side) of base 402 (referred to hereinafter as a first metal layer 408a and a second metal layer 408b). For consistency of description the term "first metal layer" will be used to refer to the portion of metal layer 408 that remains to a left (first) side of base 402 adjacent to the dielectric layer and the term "second metal layer" will be used to refer to the portion of metal layer 408 that remains to a right (second) side of base 402 adjacent to the dielectric layer. This name assignment is however arbitrary.

Since first metal layer 408a and second metal layer 408b originate from the same metal layer (metal layer 408), first metal layer 408a and second metal layer 408b have a same (or approximately the same) composition and physical properties, such as thickness. At this point in the process, the steps taken can vary depending on whether or not another metal layer, i.e., a third metal layer including a different band edge metal(s) is employed. Namely, FIGS. 4G-I depict the use of a third metal layer in the trigate, whereas FIGS. 4J-L depict a trigate without a third metal layer.

Either configuration depicted in FIGS. 4G-I or in FIGS. 4J-L will achieve a dual Vt trigate. However, it may be desirable to use a third metal layer with its associated band edge metal to aid in "fine-tuning" the threshold voltages of the sides of the trigate relative to the top of the trigate, and vice versa. Namely, most metal gates typically have mid-gap workfunctions. With a short channel length MOSFET device (i.e., having a channel length that is less than 0.1 micrometers (μm)) that has a base of either partially depleted SOI or bulk silicon with a SOI thickness $T_{SOI}$ (see FIG. 1) or a silicon thickness $T_{silicon}$, respectively of $\geq 30$ nm, there is a penalty in terms of short channel control for being off band edge. In order to control Vt to an acceptable loss, the channel doping has to be greatly reduced as compared to a band edge device, i.e., typically reduced by from about 30 percent (%) to about 60%. The reduced channel doping degrades the short channel response. If the channel doping is not reduced, the Vt will be typically too high.

Alternatively, for a MOSFET device with a thinner base, such as fully depleted SOI (i.e., $T_{SOI} \leq 30$ nm) doping no longer sets the Vt. In this regime of device thickness, a quarter gap and/or mid-gap metal would provide acceptable Vt in many cases. Therefore, by way of example only, for the thicker, partially depleted SOI (or bulk silicon)-based devices, the top and sides of the gate would probably need band edge metals applied (FIGS. 4G-I), unless a very much larger Vt (e.g., from about 800 millivolts (mV) to about one volt (V)) for the top of the gate is needed. For the thinner, fully depleted SOI-based devices, band edge metals at the sides and top of the gate could still be used, but the likelihood increases that the band edge metal at the top of the gate could be omitted, as this Vt would not be as high in a fully depleted device. Thus, the band edge metal(s) would be used only at the sides of the gate (FIGS. 4J-L). Incentives to omit the additional band edge metal would be lower process costs and process simplification.

As shown in FIG. 4G, a third metal layer 416 is deposited over a portion of dielectric layer 406 on top of base 402 and over offset spacers 412/414. Like first and second metal layers 408a and 408b, third metal layer 416 also includes a conventional gate metal, such as TiN, TaN and/or TaC, doped with at least one band edge metal. However, the band edge metal in third metal layer 416 is different from the band edge metal in first and second metal layers 408a and 408b (in order to achieve a dual Vt trigate). The portions of third metal layer 416 in contact with offset spacers 412/414 would not impact the Vt of the sides of the gate because offset spacers 412/414 protect the sides of the gate from the effects of the band edge metal in third metal layer 416. Third metal layer 416 can include one or more of the following band edge metals, Mg, Ba, Sr (group IIA), La, Y Dy, Ce, Pr, Yb and Lu (group IIIB) for NMOSFET, and Al, Rh, Re, Pt, W, Ni, Co, $AlO_2$, $TiO_2$, $Ta_2O_5$, NiO and $Co_2O_3$ for PMOSFET. According to an exemplary embodiment, third metal layer 416 is formed by first depositing the conventional gate metal over the top of the gate stack, offset spacers 412/414 and dielectric layer 406 using CVD, ALD, sputtering or thermal evaporation to a thickness of from about five nm to about 50 nm. The appropriate band edge metal(s) is then deposited over the conventional gate metal again using CVD, ALD, sputtering or thermal evaporation to a thickness of from about two Å to about three Å. The conventional and band edge metals are then interdiffused throughout third metal layer 416 using an annealing process which can be conducted immediately after the metal depositions, or alternatively, after completion of the gate as part of a final source/drain activation anneal.

As shown in FIG. 4H, a top electrode layer 418 is deposited over third metal layer 416. Top electrode layer 418 can include one or more of TiN, TaC and TaN, and can be deposited over third metal layer 416 using ALD to a thickness of from about five nm to about 50 nm.

As shown in FIG. 4I, polysilicon layer 420 may be deposited over top electrode layer 418. This step is optional. For example, a polysilicon layer may be used to make the gate compatible with subsequent self-aligned silicidation (i.e., when the source/drain regions of the device are silicided). Alternatively, a contact scheme that is compatible with a metal gate would eliminate the need for the polysilicon layer. Additionally, some metal gates (such as TiN/TaN) have lower conductance than silicided polysilicon, so the polysilicon gate that received subsequent silicidation might have lower resistance along the gate. Polysilicon layer 420 can be deposited over top electrode layer 418 using CVD, PECVD or RTCVD to a thickness of from about 30 nm to about 150 nm. Polysilicon layer 420 can be either pre-doped or doped later during source/drain formation.

Due to the presence of one band edge metal at the sides of the gate and a second band edge metal on the top of the gate, the gate will have a dual Vt configuration with the sides (i.e., S1 and S2) of the gate both having a first threshold voltage, i.e., threshold voltage $Vt_1$, and the top (i.e., T) of the gate having a second threshold voltage, i.e., threshold voltage $Vt_2$, wherein $Vt_2 > Vt_1$. $Vt_1$ can be varied relative to $Vt_2$ and vice versa, e.g., by varying one or more of the content and thickness of first metal layer/second metal layer and/or the third metal layer.

As highlighted above, FIGS. 4J-L depict a trigate without a second band edge metal. As shown in FIG. 4J, offset spacers 412 and 414, which were left undoped (see above), are removed. Offset spacers 412 and 414 can be removed using wet etching or a silicon-specific RIE.

As shown in FIG. 4K, a top electrode layer 422 is deposited over first and second metal layers 408a and 408b/dielectric layer 406 (i.e., over a portion of the dielectric layer on top of the base). Top electrode layer 422 can include doped polysilicon or a metal, such as TiN, TaC or TaN. According to an exemplary embodiment, top electrode layer 422 includes TiN and is deposited using ALD to a thickness of from about five nm to about 50 nm.

As shown in FIG. 4L, a polysilicon layer 424 may be deposited over top electrode layer 422. This step is optional. As highlighted above, a polysilicon layer may be used to make the gate compatible with subsequent self-aligned silicidation (i.e., when the source/drain regions of the device are silicided). Like polysilicon layer 420, described above, polysilicon layer 424 can be deposited using CVD, PECVD or RTCVD to a thickness of from about 30 nm to about 150 nm. Polysilicon layer 424 can be either pre-doped or doped later during source/drain formation.

As above, due to the presence of a band edge metal only at the sides of the gate (i.e., there is no band edge metal present at the top of the gate), the gate will have a dual Vt configuration with the sides (i.e., S1 and S2) of the gate both having a first threshold voltage, i.e., threshold voltage $Vt_1$, and the top (i.e., T) of the gate having a second threshold voltage, i.e., threshold voltage $Vt_2$, wherein $Vt_2 > Vt_1$. $Vt_1$ can be varied relative to $Vt_2$ and vice versa, e.g., by varying one or more of the content and thickness of first and second band edge metal layers 408a and 408b.

After the dielectric plus metal and/or polysilicon is deposited, gate lithography and subsequent etch processes are used to form the gate stack. These lithography and etching steps are known to those of skill in the art and thus are not described further herein. The gate is self-aligned, in that the top and sides of the gate are preferably formed with only one lithography and subsequent etch step. Therefore, the top and sides are aligned to each other.

Any further standard processing of the gate may then be carried out, if required. By way of example only, the gate can be annealed, e.g., to interdiffuse the metals in the metal layers as described above. The gate is now completed.

Standard processing can then also be used to form source and drain regions on opposite sides of the gate. For example, switching now to a view from vantage point B (see, for example, FIG. 3), FIG. 4M shows a completed trigate formed as described above. The particular trigate shown in this example does not have a second band edge metal, however, either trigate configuration (with or without a second band edge metal) applies to this description. FIGS. 4N-O illustrate the formation of either a source region or a drain region on one side of the trigate, howefver it is to be understood that the same processes apply to forming the counterpart source region or drain region on the opposite side of the trigate. As shown in FIG. 4N, offset spacers 428 are formed on either side of the trigate. According to an exemplary embodiment, the offset spacers include SiN. Dopants are introduced into BOX 404 in the source/drain regions (and into the polysilicon layer if not pre-doped (see above)). As shown in FIG. 4O, epitaxial silicon 430 is grown in the source/drain regions and offset spacers 428 (see FIG. 4N) are removed and replaced by final spacers 432. Source/drain implants are introduced to the region, followed by a rapid thermal anneal. As a result, the source/drain regions are formed. Silicide contacts (not shown) to the source/drain regions may also be formed. The specific parameters for source region/drain region and silicide formation techniques are well known to those of skill in the art and thus are not described further herein. As highlighted above, the channel formed from the base extends between the source and drain regions.

It is also possible for a trigate device having a thick base, e.g., a $T_{SOI}$ or $T_{silicon}$ of greater than or equal to about 25 nm, to not use an epitaxial source/drain region. Thus, for base thicknesses of greater than or equal to about 25 nm, the epitaxially grown source/drain growth may not be needed and this region may instead be directly implanted (see above) and silicided to form the source/drain region.

According to an exemplary embodiment, the trigate has a side:top:side aspect ratio of about 1:1:1. In that instance, the top of the gate will contribute about ⅓ of the total MOSFET contribution. Namely, with a trigate, it is assumed that the top of the gate has a significant importance, relative to the sides of the gate. Other configurations are presented in the Examples below, however wherein the aspect ratio is scaled.

The present techniques are further described by reference to the following non-limiting Examples:

EXAMPLE 1

A dual Vt finFET device (e.g., fabricated according to the methodology outlined in FIGS. 2A-I, above) and a conventional single Vt finFET device were compared at two $V_{dd}$ levels, i.e., a $V_{dd1}$ of one V and a $V_{dd2}$ of 0.5V (wherein a ΔVt, i.e., a difference between $Vt_1$ and $Vt_2$, of about 400 mV was assumed). For the dual Vt finFET device, active power consumption at 0.5V was about five times lower than at one V (i.e., capacitance (C)×$V^2$=0.18). By comparison, with the single Vt device, there was no drop in C, so active power consumption at 0.5V was only about 2.5 times lower than at one V. The active power of the dual Vt finFET device at a higher $V_{dd}$ is comparable to the active power of the single Vt device.

EXAMPLE 2

In this example, existing MOSFET device designs were chosen (for example, to address situations when re-designing is not an option) and it was assumed that gate load dominates performance, i.e., the total device load is primarily gate-load dominated. However, it was desired that a device be produced that can operate at a low $V_{dd}$ (e.g., 0.5 V) and exhibit lower active power, with an acceptable drop in performance of about 20% at one V $V_{dd}$.

The following parameters were used:
1) Assume $V_{dd}$ equals one V or 0.5 V. Assume $Vt_1$=300 mV, $Vt_2$=600 mV. Then assume constant device widths which means no re-design of existing device designs. Namely, it is assumed that the circuit and device design itself remains constant. The integration of trigates can easily be accomplished without altering masks, the same masks are simply implemented using different processes to get a trigate. A migration re-map, on the other hand, would require circuit designers to modify circuits and the resulting physical layout (masks). Re-maps are typically very costly and time consuming, whereas an integration solution (such as with the present techniques) that does not alter the physical masks has a much quicker turnaround time and less associated costs. 2) Drive current I is normalized to be one V drive of the 300 mV single Vt case (see above and FIG. 5 (described below)). 3) A 10% drive loss per 100 mV overdrive is assumed. Overdrive is the amount of gate voltage greater than Vt.

FIG. 5 is table 500 illustrating performance of two single Vt FET devices, i.e., having $Vt_1$ and $Vt_2$, respectively, wherein $Vt_1$=300 mV and $Vt_2$=600 mV, and a dual Vt finFET device. In table 500, capacitance (C), drive current (I), power and performance are shown for both a $V_{dd}$ of one V and a $V_{dd}$ of 0.5 V for Case 1 (single $Vt_1$=300 mV), Case 2 (single $Vt_2$=600 mV) and Case 3 (dual Vt). Thus with the present dual Vt FET designs, advantageously, for low $V_{dd}$ operation, one can get the same performance with half of the active power, with a one V performance penalty, assuming front end of line (FEOL) dominated performance.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a FET device, comprising the steps of:
    patterning a plurality of fins in a silicon-on-insulator (SOI) layer each fin having a first side and a second side opposite the first side;
    forming a dielectric layer over each of the fins;
    forming a gate that surrounds at least a portion of each of the fins and is separated from the fins by the dielectric layer, the gate being configured to have multiple threshold voltages due to the selective placement of at least one band edge metal throughout the gate such that a portion of the gate adjacent to the first side of each of the fins is configured to have a threshold voltage $Vt_1$ and a portion of the gate adjacent to the second side of each of the fins is configured to have a threshold voltage $Vt_2$, wherein $Vt_2$ is different from $Vt_1$ due to the at least one band edge metal being present in the portion of the Rate adjacent to the second side of each of the fins, and wherein the step of forming the gate further comprises the steps of:
    depositing a first metal layer over the dielectric layer; and selectively depositing a series of second metal layers over portions of the first metal layer at the second side of each fin; and
    forming a source region and a drain region interconnected by the fins.

2. The method of claim 1, wherein the step of selectively depositing the series of second metal layers, further comprises the steps of:
    depositing a gate metal over the portions of the first metal layer at the second side of each of the fins;
    depositing the at least one band edge metal over the gate metal; and
    interdiffusing the gate metal and the band edge metal throughout the second metal layers.

3. The method of claim 1, further comprising the steps of:
    depositing a third metal layer over the first and second metal layers; and
    depositing a polysilicon layer over the third metal layer.

4. The method of claim 1, wherein $Vt_2$ is different from $Vt_1$ due to the at least one band edge metal being present at a greater concentration in the portion of the gate adjacent to the second side of each of the fins.

5. A method for fabricating a FET device comprising the steps of:
    patterning a base in a SOI layer having a first side, a second side opposite the first side and a top;
    forming a dielectric layer over the base; forming a gate that surrounds at least a portion of the base and is separated from the base by the dielectric layer, the gate being configured to have multiple threshold voltages due to the selective placement of at least one band edge metal throughout the gate such that portions of the gate adjacent to the first and second sides of the base are each configured to have a threshold voltage $Vt_1$ and a portion of the gate adjacent to the top of the base is configured to have a threshold voltage $Vt_2$, wherein $Vt_2$ is different from $Vt_1$ due to the at least one band edge metal being present in the portions of the gate adjacent to the first and second sides of the base, and wherein the step of forming the gate further comprises the steps of:
    forming a first metal layer and a second metal layer on opposite sides of the base, the first and second metal lavers both comprising the at least one band edge metal; and forming offset spacers on each side of the base adjacent to the first and second metal layers; and forming a source region and a drain region on opposite sides of the gate.

6. The method of claim 5, wherein the step of forming the first and second metal layers further comprises the steps of:

depositing a metal layer over the dielectric layer, wherein the metal layer comprises the band edge metal; and selectively removing the metal layer from over a portion of the dielectric layer on top of the base.

7. The method of claim 5, further comprising the steps of:

removing the offset spacers; and depositing a top electrode layer over the first and second metal layers and over a portion of the dielectric layer on top of the base.

8. The method of claim 7, further comprising the step of: depositing a polysilicon layer over the top electrode layer.

9. The method of claim 5, further comprising the steps of:

depositing a third metal layer over the offset spacers and over a portion of the dielectric layer on top of the base, wherein the third metal layer comprises a band edge metal that is different from the band edge metal in the first and second metal layers; and depositing a top electrode layer over the third metal layer.

10. The method of claim 9, further comprising the step of: depositing a polysilicon layer over the top electrode layer.

11. The method of claim 5, wherein $Vt_2$ is different from $Vt_1$ due to the at least one band edge metal being present in the portions of the gate adjacent to the first and second sides of the base and absent from the portion of the gate adjacent to the top of the base.

* * * * *